United States Patent
Lee et al.

(10) Patent No.: US 12,532,487 B2
(45) Date of Patent: Jan. 20, 2026

(54) CAPACITOR AND ELECTRONIC DEVICE INCLUDING THE SAME

(71) Applicant: Samsung Electronics Co., Ltd., Suwon-si (KR)

(72) Inventors: Changsoo Lee, Suwon-si (KR); Jinhong Kim, Suwon-si (KR); Cheheung Kim, Hwaseong-si (KR); Jooho Lee, Suwon-si (KR); Yong-Hee Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 377 days.

(21) Appl. No.: 18/350,397

(22) Filed: Jul. 11, 2023

(65) Prior Publication Data

US 2024/0258366 A1 Aug. 1, 2024

(30) Foreign Application Priority Data

Jan. 26, 2023 (KR) ........................ 10-2023-0010228

(51) Int. Cl.
*H10D 1/68* (2025.01)
*H01L 21/02* (2006.01)
(Continued)

(52) U.S. Cl.
CPC ....... *H10D 1/716* (2025.01); *H01L 21/02186* (2013.01); *H10B 12/315* (2023.02);
(Continued)

(58) Field of Classification Search
CPC ........ H10D 1/684; H10D 1/688; H10D 1/714; H10D 1/716; H10D 64/691; H10B 12/315;
(Continued)

(56) References Cited

U.S. PATENT DOCUMENTS

| 8,652,927 | B2 | 2/2014 | Malhotra et al. |
| 8,679,939 | B2 | 3/2014 | Malhotra et al. |

(Continued)

FOREIGN PATENT DOCUMENTS

| EP | 2608250 A2 | 6/2013 |
| KR | 10-2007-0040714 A | 4/2007 |

(Continued)

OTHER PUBLICATIONS

KR 20080102626 A—Machine English Translation (Year: 2025).*

(Continued)

*Primary Examiner* — Jose R Diaz
(74) *Attorney, Agent, or Firm* — Harness, Dickey & Pierce, P.L.C.

(57) ABSTRACT

A capacitor is provided. The capacitor includes a first electrode, a second electrode disposed to face the first electrode, a dielectric layer of a rutile phase, disposed between the first electrode and the second electrode, and an interface layer between the first electrode and the dielectric layer, wherein the interface layer includes a first interface layer and a second interface layer, the first interface layer is adjacent to the first electrode, the second interface layer is adjacent to the dielectric layer, the first interface layer includes a conductive metal oxide having a work function in a range of about 4.8 eV to about 6.0 eV, the second interface layer includes a metal oxide having a rutile-phase crystal structure, and a thickness of the second interface layer is smaller than a thickness of the first interface layer.

20 Claims, 26 Drawing Sheets

(51) Int. Cl.
*H10B 12/00* (2023.01)
*H10D 1/60* (2025.01)
*H10D 64/68* (2025.01)

(52) U.S. Cl.
CPC ............... *H10D 1/60* (2025.01); *H10D 1/68* (2025.01); *H10D 1/682* (2025.01); *H10D 1/684* (2025.01); *H10D 1/688* (2025.01); *H10D 1/714* (2025.01); *H10D 64/691* (2025.01)

(58) Field of Classification Search
CPC .. H10B 12/033; H10B 12/30; H01L 21/02186
See application file for complete search history.

(56) References Cited

U.S. PATENT DOCUMENTS

| | | | |
|---|---|---|---|
| 8,722,504 | B2 | 5/2014 | Deweerd et al. |
| 8,896,097 | B2 * | 11/2014 | Wamura .............. H01L 21/022 257/532 |
| 9,281,357 | B2 | 3/2016 | Chen et al. |
| 12,087,810 | B2 * | 9/2024 | Kim .................... H01G 4/1218 |
| 2013/0071988 | A1 | 3/2013 | Deweerd et al. |
| 2013/0100577 | A1 | 4/2013 | Popovici |
| 2021/0317596 | A1 | 10/2021 | Son et al. |

FOREIGN PATENT DOCUMENTS

| | | | | |
|---|---|---|---|---|
| KR | 20080102626 A | * | 11/2008 | ............. H10D 1/696 |
| KR | 10-2021-0127589 A | | 10/2021 | |
| KR | 10-2024-0043591 | | 4/2024 | |

OTHER PUBLICATIONS

Mark T. Greiner, "Transition Metal Oxide Work Functions: The Influence of Cation Oxidation State and Oxygen Vacancies," Advanced Functional Materials, Vo. 22, pp. 4557-4568, Jun. 26, 2012.
Notice of Non-Final Rejection issued Jan. 8, 2024 in Korea Application No. 10-2023-0010228.
Dong-Kwon Lee et al., "Growth of rutile-TiO2 thin films via Sn doping and insertion of ultra-thin SnO2 interlayer by atomic layer deposition," Materials Letters, Mar. 9, 2019.

* cited by examiner

FIG. 5
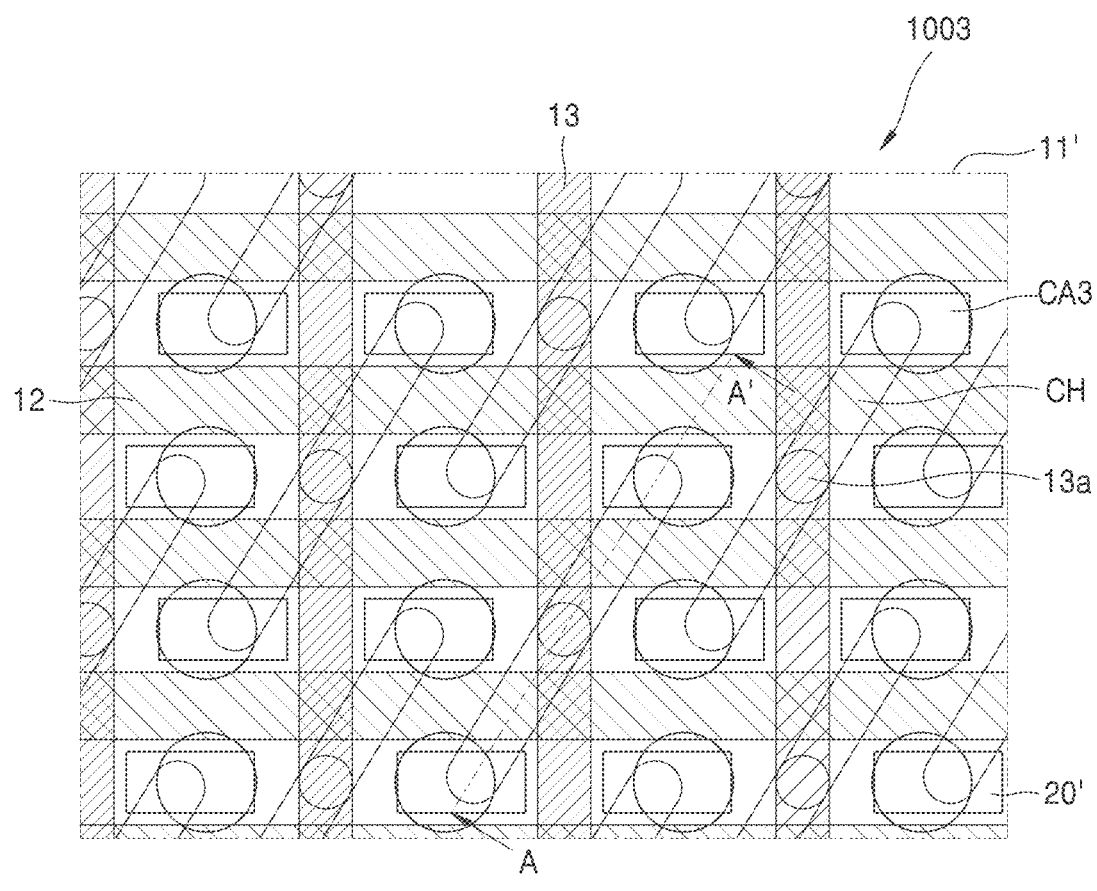
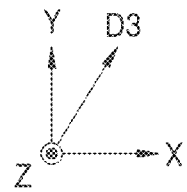

CAPACITOR AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2023-0010228, filed on Jan. 26, 2023, in the Korean Intellectual Property Office, the disclosure of which is incorporated by reference herein in its entirety.

BACKGROUND

1. Field

The disclosure relates to a capacitor and an electronic device including the same.

2. Description of the Related Art

As the integration density of electronic devices, such as memory, is increased, electronic elements in electronic devices are becoming more and more miniaturized. As the sizes of capacitors are decreased, capacitance may decrease and leakage current may increase. To ensure capacitance, research is being conducted into methods for increasing the dielectric constant of dielectric layers, and methods for suppressing an increase in leakage current.

SUMMARY

Provided are a capacitor of which equivalent oxide film thickness and leakage current characteristics are improved by applying a dielectric layer formed of a high dielectric constant material, and an electronic device including the same.

Additional aspects will be set forth in part in the description which follows and, in part, will be apparent from the description, or may be learned by practice of the presented some embodiments of the disclosure.

Provided is a capacitor including a first electrode, a second electrode facing the first electrode, a dielectric layer between the first electrode and the second electrode, the dielectric layer comprising a dielectric of a rutile phase, and an interface layer between the first electrode and the dielectric layer, the interface layer including a first interface layer adjacent to the first electrode and a second interface layer between the dielectric layer and the first interface layer.

The first interface layer includes a conductive metal oxide having a work function in a range of about 4.8 eV to about 6.0 eV, the second interface layer includes a metal oxide having a rutile-phase crystal structure, and a thickness of the second interface layer may be smaller than the thickness of the first interface layer.

The first interface layer may include $VO_x$, wherein x is within a range of 2 to 3.

The first interface layer may be doped with at least one of tungsten (W), tantalum (Ta), or niobium (Nb).

The thickness of the first interface layer may be greater than or equal to about 10 Å and less than or equal to about 100 Å.

The second interface layer may include at least one of $GeO_2$ and $SnO_2$.

The thickness of the second interface layer may be greater than or equal to about 0.1 Å and less than or equal to about 10 Å.

An oxygen chemical potential of the second interface layer may be greater than an oxygen chemical potential of the first interface layer.

The first electrode may include TiN, VN, MoN, or a composite thereof.

The dielectric of the dielectric layer may include rutile-phase $TiO_2$.

The dielectric layer may include at least one element of gallium (Ga), aluminum (Al), lanthanum (La), boron (B), indium (In), scandium (Sc) and yttrium (Y) in an amount greater than or equal to about 0 atom % and less than or equal to about 10 atom %.

A dielectric constant of the dielectric layer may be 50 or more.

A thickness of the dielectric layer may be in a range of about 1 nm to about 20 nm.

Each of the first electrode and the second electrode may have a thickness in a range of about 10 nm to about 100 nm.

The capacitor may have the leakage current within a range of $1\times10^{-2}$ A/cm$^2$ to $1\times10^{-8}$ A/cm$^2$.

Provided is an electronic device including a transistor, and a capacitor electrically connected to the transistor.

The capacitor may include a first electrode, a second electrode facing the first electrode, a dielectric layer between the first electrode and the second electrode, the dielectric layer including a dielectric of a rutile phase, and an interface layer between the first electrode and the dielectric layer, the interface layer including a first interface layer adjacent to the first electrode and a second interface layer between the first interface layer and the dielectric layer.

The first interface layer may include a conductive metal oxide having a work function in the range of about 4.8 eV to about 6.0 eV.

The second interface layer may include a metal oxide having a rutile-phase crystal structure.

The thickness of the second interface layer may be smaller than the thickness of the first interface layer.

The first interface layer may include $VO_x$, wherein x is within in a range of 2 to 3.

The first interface layer may be doped with at least one of tungsten (W), tantalum (Ta), or niobium (Nb).

The second interface layer may include at least one of germanium oxide ($GeO_2$), tin oxide ($SnO_2$), or manganese oxide ($MnO_2$).

The second interface layer may have a thickness with a range of about 0.1 Å to about 10 Å.

The dielectric of the dielectric layer may include rutile-phase $TiO_2$.

BRIEF DESCRIPTION OF THE DRAWINGS

The above and other aspects, features, and advantages of certain some embodiments of the disclosure will be more apparent from the following description taken in conjunction with the accompanying drawings, in which:

FIG. 5 is a plan view illustrating an electronic device according to at least one embodiment;

DETAILED DESCRIPTION

Figure 1:
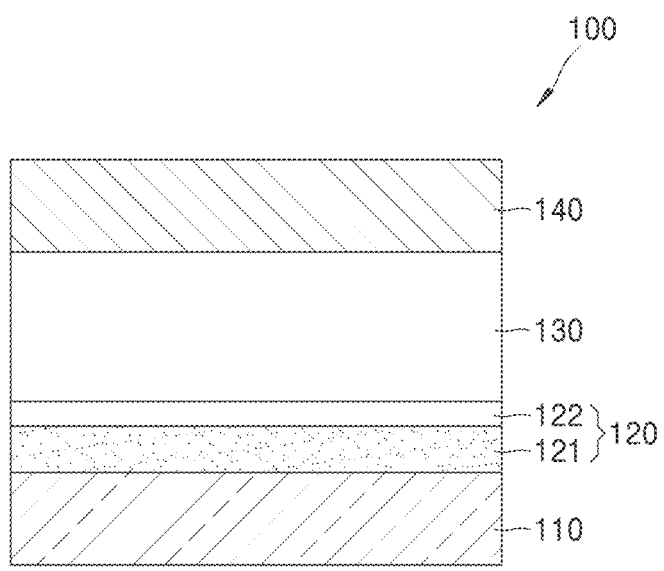
FIG. 1 is a cross-sectional view showing a schematic structure of a capacitor according to at least one embodiment.

Reference will now be made, for example to some embodiments, examples of which are illustrated in the accompanying drawings, wherein like reference numerals refer to like elements throughout. In this regard, the present some embodiments may have different forms and should not be construed as being limited to the descriptions set forth herein. Accordingly, the some embodiments are merely described below, by referring to the figures, to explain aspects. As used herein, the term "and/or" includes any and all combinations of one or more of the associated listed items. Expressions such as "at least one selected from," when preceding a list of elements, modify the entire list of elements and do not modify the individual elements of the list.

Hereinafter, with reference to the attached drawings, a capacitor and an electronic device including the same will be described. For example, in the following drawings, the size of each component in the drawings may be exaggerated for clarity and convenience of description. In addition, the some embodiments described below are an example only, and can be subjected to various modifications. Additionally, when the terms "about" or "substantially" are used in this specification in connection with a numerical value and/or geometric terms, it is intended that the associated numerical value includes a manufacturing tolerance (e.g., ±10%) around the stated value and/or term. Further, regardless of whether numerical values and/or geometric terms are modified as "about" or "substantially," it will be understood that these values should be construed as including a manufacturing or operational tolerance (e.g., ±10%) around the stated numerical values and/or geometry. When referring to "within" and/or "C to D", this means C inclusive to D inclusive unless otherwise specified.

Hereinafter, "above" or "on" may include not only what is directly disposed immediately above while being in contact but also that while being in non-contact. It will also be understood that spatially relative terms, such as "above", "top", etc., are intended to encompass different orientations of the device in use or operation in addition to the orientation depicted in the figures, and that the device may be otherwise oriented (rotated 90 degrees or at other orientations) and the spatially relative terms used herein interpreted accordingly. An expression used in the singular encompasses the expression of the plural, unless it has a clearly different meaning in the context. In addition, when a certain component is said to "include", this means that it may further include other components without excluding other components unless otherwise stated.

The use of the term "the" and terms denoting may correspond to both singular and plural. Unless the order of processes constituting a method is explicitly stated or stated to the contrary, these processes may be performed in any suitable order, and are not necessarily limited to the order described.

In addition, functional terms such as those including " . . . unit" described in the specification refer to a unit that is configured to process at least one function or operation, which may be implemented through processing circuitry such as hardware or software or a combination of hardware and software. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc., and/or electronic circuits including said components.

Connections of lines between components shown in the drawings, or connecting members are examples of functional connections and/or physical or circuit connections, which can be replaced in actual devices or additional various functional connections, physical connections, or as circuit connections.

The use of all examples or exemplary terms is simply for explaining technical ideas. For example, the scope is not limited by these examples or exemplary terms unless limited by the claims.

FIG. 1 is a cross-sectional view showing a schematic structure of a capacitor 100 according to at least one embodiment. Referring to FIG. 1, the capacitor 100 may include a first electrode 110, a second electrode 140 disposed opposite to the first electrode 110, a dielectric layer 130 disposed between the first electrode 110 and the second electrode 140, and an interface layer 120 between the first electrode 110 and the dielectric layer 130.

The dielectric layer 130 includes a rutile phase dielectric. For example, the dielectric layer 130 may include rutile-phase $TiO_2$. The phase of the dielectric (e.g., $TiO_2$) has an effect on the dielectric constant, and therefore the dielectric constant may vary depending on the phase. For example, anatase-phase $TiO_2$ may exhibit a dielectric constant of about 40, and rutile-phase $TiO_2$ may exhibit a large dielectric constant value ranging from about 80 to 170 depending on the direction of growth thereof. Accordingly, the dielectric layer 130 including $TiO_2$ may have a dielectric constant of greater than or equal to about 80 and/or less than or equal to about 170.

The dielectric layer 130 may include $TiO_2$ alone, or $TiO_2$ containing a certain dopant. For example, the dielectric layer 130 may be include a dopant of at least one of gallium (Ga), aluminum (Al), lanthanum (La), boron (B), indium (In), scandium (Sc), yttrium (Y), and/or the like in an amount greater than or equal to about 0 atom % and/or less than or equal to 10 atom %. Although rutile-phase $TiO_2$ exhibits a high permittivity, the band gap thereof is as small as about 3 eV and thus the leakage current is high. Accordingly, rutile-phase $TiO_2$ may not satisfy the leakage current specification required for the capacitor 100. A dopant contained in the dielectric layer 130 may increase a band gap of the dielectric layer 130, thereby improved leakage current characteristics of the dielectric layer 130. The dielectric constant of the dielectric layer 130 including the dopant may be slightly lowered. For example, the dielectric layer 130 including the dopant may have a dielectric constant of about 50 or more.

According to the at least one embodiment, since the dielectric layer 130 has high permittivity, the thickness of the dielectric layer 130 may be reduced and the capacitor 100 may be further manufactured in smaller sizes. For example, the dielectric layer 130 may have a thickness of about 20 nm or less, about 15 nm or less, and/or about 10 nm or less. In at least one embodiment, for example, the dielectric layer 130 may have a thickness of 10 Å or more, 20 Å or more, or 50A or more. For example, in at some embodiments the thickness of the dielectric layer 130 may be within the range of about 10 Å to about 200 Å, about 10 Å to about 150 Å, and/or about 10 to about 100 Å.

The first electrode 110 may be configured to grow a dielectric layer 130 of a rutile phase thereon; and reduce leakage current. For example, a material for the first electrode 110 may be selected to guarantee conductivity as an electrode and to maintain stable capacitance performance even after a high-temperature process in manufacturing the capacitor 100. In addition, included is a crystalline conductive material that allows $TiO_2$ of the dielectric layer 130 formed on the first electrode 110 to be well formed into a rutile phase exhibiting a high permittivity. To this end, the first electrode 110 may include a conductive transition metal oxide and/or a conductive transition metal nitride. The first electrode 110 may include, for example, a conductive transition metal oxide having a rutile phase and/or a conductive transition metal nitride having a rutile phase.

In at least one embodiment, the first electrode 110 may include, for example, a transition metal nitride such as TiN, VN, MoN, and/or the like. When the first electrode 110 includes a metal nitride, compared to a metal oxide electrode, deterioration in electrode characteristics (e.g., due to separation of oxygen from the first electrode 110 to the dielectric layer 130) may be mitigated and/or prevented.

In at least one embodiment, the first electrode 110 may include $SnO_2$ doped with a dopant including a metal and/or metal oxide. The dopant may include, for example, at least one selected from tungsten (W), tantalum (Ta), niobium (Nb), antimony (Sb), manganese (Mn), fluorine (F), ruthenium oxide ($RuO_2$), iridium oxide ($IrO_2$), molybdenum oxide ($MoO_2$), and/or the like. The amount of the dopant may be, for example, greater than or equal to about 0.01 atom % and less than or equal to 10 atom %. Regarding the first electrode 110 containing $SnO_2$, the dopant improves the chemical stability of $SnO_2$ at room temperature, thereby reducing the probability that the Sn component in the first electrode 110 is reduced to metal and/or preventing or mitigating a decrease in the electrical conductivity of the first electrode 110.

The interface layer 120 has a multilayer structure, including a first interface layer 121 adjacent to the first electrode 110 and a second interface layer 122 adjacent to the dielectric layer 130.

A material for the first interface layer 121 may be selected to reduce leakage current of the dielectric layer 130. For example, in order to prevent or mitigate the movement of oxygen ions from the first electrode 110 (including an oxide) to the dielectric layer 130, the first interface layer 121 may include a transition metal oxide having an oxygen chemical potential between the oxygen chemical potential of the first electrode 110 and the oxygen chemical potential of the dielectric layer 130. In these cases, the deterioration where the transition metal in the first electrode 110 including oxide is reduced and/or the work function of the first electrode 110 is lowered, may be prevented or mitigated.

In addition, the material for the first interface layer 121 may be selected such that a conduction band offset (CBO) thereof with the dielectric layer 130 is in the range of about 1.0 eV to about 1.8 eV. For example, in at least one embodiment, the material for the first interface layer 121 may be selected to have a work function in the range of 4.8 eV to 6.0 eV. When the material of the first interface layer 121 has this range of CBO with respect to the dielectric layer 130, the leakage current may be limited due to the barrier effect. Furthermore, the material for the first interface layer 121, like the first electrode 110, may be selected from materials that have conductivity, maintains stable capacitance performance even after a high-temperature process in the manufacturing process of the capacitor 100, and allow the formation of rutile phase $TiO_2$ thereon. For example, the material for the first interface layer 121 may include a conductive transition metal oxide having a rutile phase.

For example, the first interface layer 121 may include a crystal of vanadium oxide ($VO_x$), and x may be greater than or equal to 2 and less than or equal to 3. For example, the first interface layer 121 may include a crystal of at least one selected from $VO_2$, $V_2O_5$, and/or $VO_3$. In these cases, the vanadium oxide of the first interface layer 121 may be formed to have a rutile phase. When the first interface layer 121 includes such vanadium oxide, a conduction band offset of about 1.25 eV or more may be ensured between the first electrode 110 and the dielectric layer 130 to limit the leakage current.

The greater the thickness of the first interface layer 121 is, the smaller the leakage current is. However, to meet the integration requirements for the corresponding miniaturization of the capacitor 100, the thickness of the first interface layer 121 may be, for example, about 10 nm or less, and/or about 5 nm or less; and/or the thickness of the first interface layer 121 may be, for example, 10 Å or more. For example, in at least one embodiment, the thickness of the first interface layer 121 may be in the range of about 10 Å to about 50 Å and/or about 10 Å to about 100 Å.

A material for the second interface layer 122 may include a transition metal oxide having an oxygen chemical potential between the oxygen chemical potential of the first interface layer 121 and the oxygen chemical potential of the dielectric layer 130. Meanwhile, since the material for the second interface layer 122 is adjacent to the dielectric layer 130, the second interface layer 122 may include a material selected to increase the ratio of the rutile phase of the dielectric layer 130. For example, the material for the second interface layer 122 may include a transition metal oxide having a stable rutile phase. For example, the material for the second interface layer 122 may include tin oxide ($SnO_2$) and/or germanium oxide ($GeO_2$).

Since $SnO_2$ or $GeO_2$ has low electrical conductivity and low permittivity compared to $TiO_2$, the second interface layer 122 may be formed to such a thickness that is sufficient to improve the rutile phase of the dielectric layer 130. The thickness of the second interface layer 122 may be smaller than a thickness of the first interface layer 112. For example, the second interface layer 122 may be formed to have a thickness within the range of about 3 Å to about 20 Å.

The second electrode 140 may include a conductive material. For example, like the first electrode 110, the second electrode 140 may have a rutile phase, but may include various conductive materials having a phase that is different from the rutile phase. The second electrode 140 may include a metal, a metal nitride, a metal oxide, and/or a combination thereof. For example, the second electrode 140 may include at least one of TiN, MoN, CoN, TaN, W, Ru, $RuO_2$, $SrRuO_3$, Ir, $IrO_2$, Pt, PtO, SRO ($SrRuO_3$), BSRO (($Ba,Sr)RuO_3$), CRO ($CaRuO_3$), LSCO (($La,Sr)CoO_3$), a combination of thereof, and/or the like.

The capacitor 100 may have improved leakage current characteristics compared to the cases of the related art. For example, the leakage current thereof may be in the range of $1\times10^{-2}$ $A/cm^2$ to $1\times10^{-8}$ $A/cm^2$, $1\times10^{-3}$ $A/cm^2$ to $1\times10^{-5}$ $A/cm^2$, and/or $10^{-3}$ $A/cm^2$ to $1\times10^{-4}$ $A/cm^2$. In addition, the capacitor 100 may have improved capacitance, and thus have a lower equivalent oxide film thickness, thereby being suitable for miniaturization of the capacitor.

Figure 2:
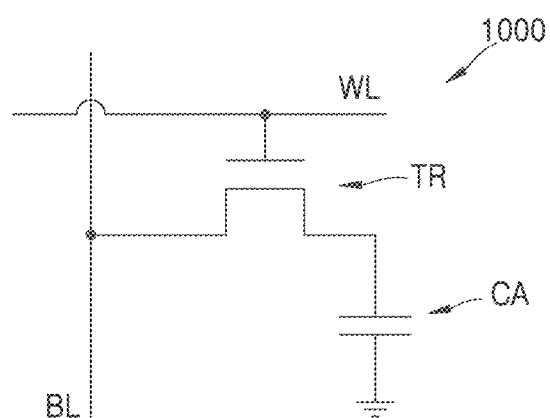
FIG. 2 is a circuit diagram illustrating a schematic circuit configuration and operation of an electronic device using a capacitor according to some embodiments.

FIG. 2 is a circuit diagram illustrating a schematic circuit configuration and operation of an electronic device 1000 using a capacitor according to some embodiments.

The circuit diagram of the electronic device 1000 is of one cell of a dynamic random access memory (DRAM) device, and may include one transistor TR, one capacitor CA, a word line WL, and a bit line BL. Though only one cell is illustrated, the DRAM device may include a plurality of cells arranged in, e.g., a matrix. The capacitor CA may be the capacitor 100 according to the examples described above.

A method of writing data on DRAM is as follows. A gate voltage (high) that makes the transistor TR be in an ON state, is applied to a gate electrode through the word line WL, and then, VDD (hereinafter referred to as "high voltage"), which is the data voltage value to be input to the bit line BL, or 0 (hereinafter referred to as "low voltage") is applied. When a high voltage is applied to a word line and a bit line, the capacitor CA is charged and data (e.g., "1") is written thereon. When high voltage is applied to a word line and low voltage is applied to a bit line, the capacitor CA is discharged and data (e.g., "0") is written thereon.

When reading data, a high voltage is applied to the word line WL to turn on the DRAM transistor TR, and then a voltage of VDD/2 is applied to the bit line BL. When the voltage of the capacitor CA is VDD, the charges in the capacitor CA gradually move to the bit line BL and the voltage of the bit line BL becomes slightly greater than VDD/2. Conversely, when the capacitor CA is discharged, the charges of the bit line BL move to the capacitor CA, and the voltage of the bit line BL becomes slightly lower than VDD/2. The potential difference of the bit line generated in this way is detected by using a sense amplifier and amplified to determine the data stored in the cell (e.g., whether the data is "0" or "1").

Figure 3:
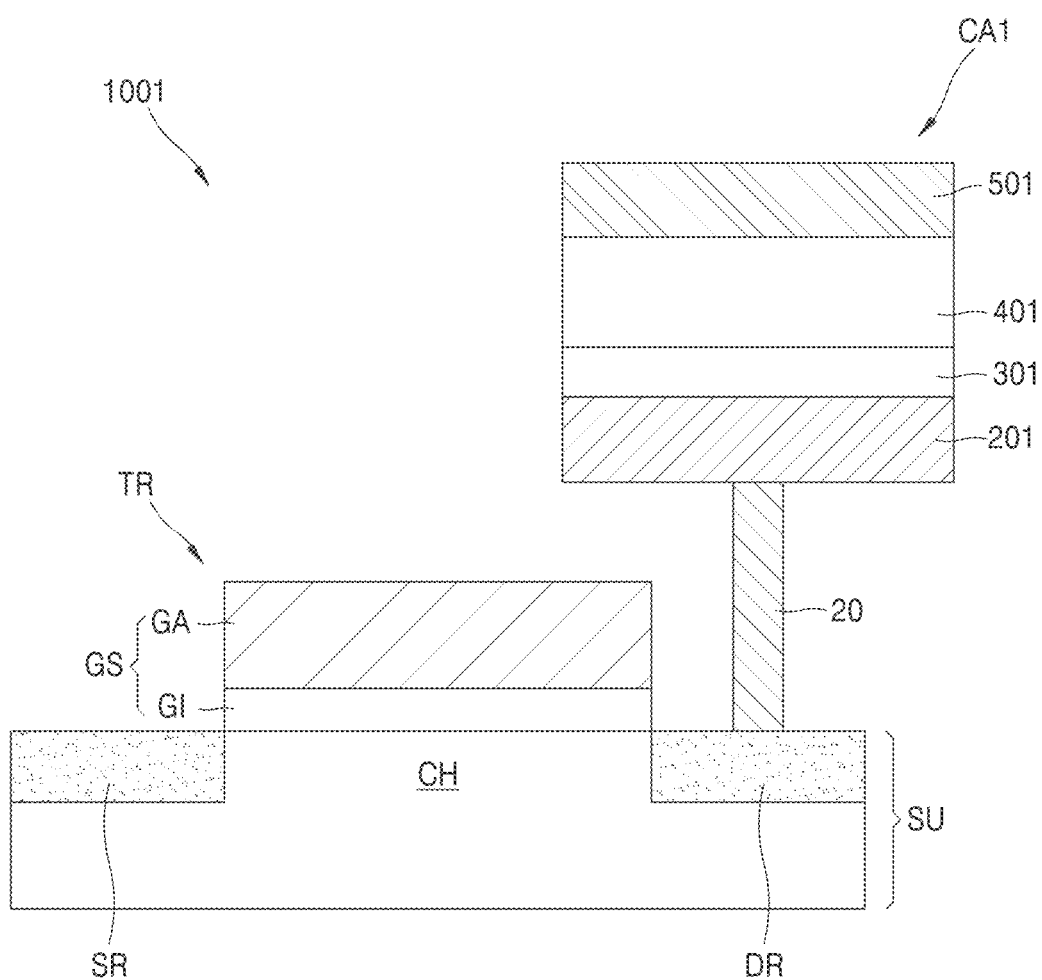
FIG. 3 is a schematic diagram illustrating an electronic device according to at least one embodiment.

FIG. 3 is a schematic diagram illustrating an electronic device 1001 according to at least one embodiment.

Referring to FIG. 3, the electronic device 1001 may include a structure in which a capacitor CA1 and a transistor TR are electrically connected by a contact 20. The capacitor CA1 may include a lower electrode 201, an upper electrode 501, a dielectric thin film 401 provided between the lower electrode 201 and the upper electrode 501, and an interface layer 301 between the lower electrode 201 and the dielectric thin film 401. Although not illustrated, the interface layer 301 includes a first interface layer and a second interface layer as described above. The capacitor CA1 may be the capacitor 100 as described in FIG. 1, and a description thereof will be omitted.

The transistor TR may be a field effect transistor. The transistor TR may include: a semiconductor substrate SU having a source region SR, a drain region DR, and a channel region CH; and a gate stack GS disposed on a semiconductor substrate SU and facing the channel region CH, and having a gate insulating layer GI and a gate electrode GA.

The channel region CH is a region between the source region SR and the drain region DR, and is electrically connected to the source region SR and the drain region DR. The source region SR may be electrically connected to or in contact with one end of the channel region CH, and the drain region DR may be electrically connected to or in contact with the other end of the channel region CH. The channel region CH may be defined as a substrate region between source region SR and drain region DR in the semiconductor substrate SU.

The semiconductor substrate SU may include a semiconductor material. The semiconductor substrate SU may include, for example, a semiconductor material, such as silicon (Si), germanium (Ge), silicon germanium (SiGe), silicon carbide (SiC), gallium arsenide (GaAs), indium arsenide (InAs), indium phosphide (InP), etc. In at least one embodiment, the semiconductor substrate SU may include a silicon on insulator (SOI) substrate.

In at least one embodiment, the source region SR, the drain region DR, and the channel region CH may be independently formed by injecting impurities into different regions of the semiconductor substrate SU, and in these cases, the source region SR, the channel region CH, and the drain region DR may include a substrate material as a base material. In at least one embodiment, the source region SR and the drain region DR may each include a conductive material. In these cases, the source region SR and the drain region DR may include, for example, a metal, a metal compound, a conductive polymer, a combination thereof, and/or the like.

Unlike illustrated, in at least one embodiment, the channel region CH may be implemented as a separate material layer (thin film). In these cases, the channel region CH may include, for example, at least one selected from Si, Ge, SiGe, a Group III-V semiconductor, oxide semiconductor, nitride semiconductor, oxynitride semiconductor, two-dimensional material (2D material), quantum dots, organic semiconductors, a combination thereof, and/or the like. For example, the oxide semiconductor may include InGaZnO, etc., the 2D material may include transition metal dichalcogenide (TMD) and/or graphene, and/or the quantum dots may include colloidal QDs and/or a nanocrystal structure.

The gate electrode GA may be disposed above the semiconductor substrate SU while being spaced apart therefrom and facing the channel region CH. The gate electrode GA may include at least one selected from metal, metal nitride, metal carbide, and polysilicon. For example, the metal may include at least one of aluminum (Al), tungsten (W), molybdenum (Mo), titanium (Ti), tantalum (Ta), a combination thereof, and/or the like; the metal nitride film may include at least one of a titanium nitride film (TiN film), a tantalum nitride film (TaN film), a combination thereof, and/or the like; and/or the metal carbide may include at least one metal carbide that is doped with aluminum, silicon, a combination thereof, and/or the like. Examples thereof are TiAlC, TaAlC, TiSiC, or TaSiC.

In at least one embodiment, the gate electrode GA may have a structure in which a plurality of materials are stacked. For example, the gate electrode GA may have a metal nitride layer/metal layer stacked structure (such as TiN/Al) and/or a metal nitride layer/metal carbide layer/metal layer stacked structure (such as TiN/TiAlC/W). However, the gate electrode GA is not limited thereto and these materials described above are only some examples.

A gate insulating layer GI may be further disposed between the semiconductor substrate SU and the gate electrode GA. The gate insulating layer GI may include a paraelectric material and/or a high-k dielectric material, and, in at least one embodiment, may have a dielectric constant of about 20 to about 70.

The gate insulating layer GI may include, for example, at least one of silicon oxide, silicon nitride, aluminum oxide, hafnium oxide, zirconium oxide, a 2D insulator (such as hexagonal boron nitride (h-BN)), and/or the like. For example, the gate insulating layer GI may include silicon oxide ($SiO_2$), silicon nitride ($SiN_x$), hafnium oxide ($HfO_2$), hafnium silicon oxide ($HfSiO_4$), lanthanum oxide ($La_2O_3$), lanthanum aluminum oxide ($LaAlO_3$); zirconium oxide ($ZrO_2$), hafnium zirconium oxide ($HfZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), red zinc niobate ($PbZnNbO_3$), and/or the like. In addition, the gate insulating layer GI may include a metal nitride oxide (such as aluminum oxynitride (AlON), zirconiumoxy nitride (ZrON), hafniumoxy nitride (HfON), lanthanumoxy nitride (LaON), yttriumoxynitride (YON), and/or the like); a silicate (such as ZrSiON, HfSiON, YSiON, LaSiON, and/or the like); and/or an aluminate (such as ZrAlON, HfAlON, and/or the like). The gate insulating layer GI may constitute a gate stack together with the gate electrode GA.

One of the electrodes 201 and 501 of the capacitor CA1 and one of the source region SR and the drain region DR of the transistor TR may be electrically connected, e.g., by the contact 20. In this regard, the contact 20 may include an appropriate conductive material such as tungsten, copper, aluminum, polysilicon, or the like.

The arrangement of the capacitor CA1 and the transistor TR may be variously modified. For example, the capacitor CA1 may be disposed on the semiconductor substrate SU or may be embedded in the semiconductor substrate SU.

FIG. 3 shows an electronic device 1001 including one capacitor CA1 and one transistor TR. However, the embodiment illustrates only an example thereof. In some embodiments, the electronic device 1001 may include a plurality of capacitors and a plurality of transistors.

Figure 4:
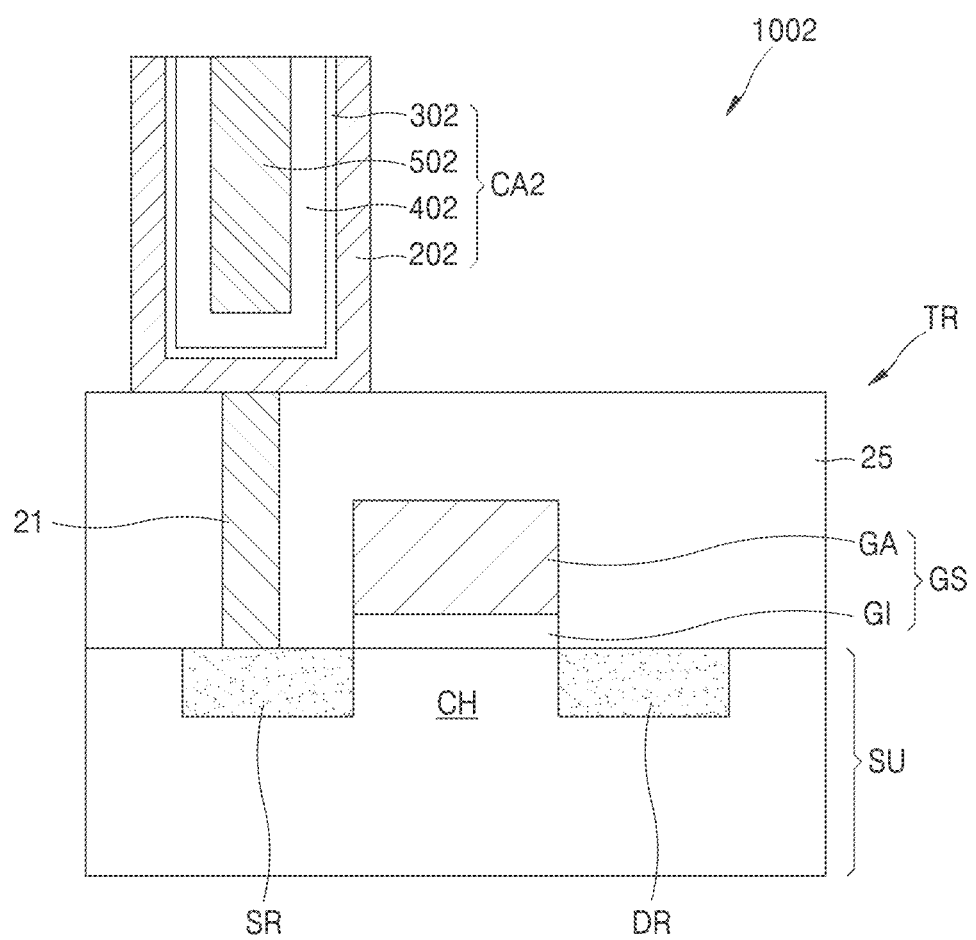
FIG. 4 is a schematic diagram illustrating an electronic device according to at least one embodiment.

FIG. 4 is a schematic diagram illustrating an electronic device 1002 according to at least one embodiment.

Referring to FIG. 4, the electronic device 1002 may include a structure in which a capacitor CA2 and a transistor TR are electrically connected to each other by a contact 21. The transistor TR may include: a semiconductor substrate SU having a source region SR, a drain region DR, and a channel region CH; and a gate stack GS disposed on a semiconductor substrate SU and facing the channel region CH, and having a gate insulating layer GI and a gate electrode GA.

An interlayer insulating layer 25 may cover the gate stack GS on the semiconductor substrate SU. The interlayer insulating layer 25 may include an insulating material. For example, the interlayer insulating layer 25 may include Si oxide (for example, $SiO_2$), Al oxide (for example, $Al_2O_3$), and/or a high dielectric material (for example, $HfO_2$). The contact 21 penetrates the interlayer insulating layer 25 and electrically connects the transistor TR and the capacitor CA1 to each other.

The capacitor CA2 may include a lower electrode 202, an upper electrode 502, a dielectric thin film 402 provided between the lower electrode 202 and the upper electrode 502, and an interface layer 302 between the lower electrode 202 and the dielectric thin film 402. Although not illustrated, the interface layer 302 includes a first interface layer and a second interface layer as described above. The lower electrode 202 and the upper electrode 502 are presented in such a shape that can increase (and/or maximize) the contact area with the dielectric thin film 402, and the material for the capacitor CA2 may be substantially the same as that of the capacitor 100 as described in FIG. 1. In at least one embodiment, at least one of the lower electrode 202 and/or the upper electrode 502 may be, for example, a cup shape and the other a column shape (such as a pillar or cylindrical shape).

FIG. 5 is a plan view illustrating an electronic device according to at least one embodiment.

Referring to FIG. 5, an electronic device 1003 may include a plurality of capacitors and a plurality of field effect transistors which are repeatedly arranged. The electronic device 1003 may include: an electric field effect transistor including a semiconductor substrate 11' including a source, a drain, and a channel, and a gate stack 12; a contact structure 20' that does not overlap the gate stack 12 and is disposed on the semiconductor substrate 11'; and a capacitor CA3 disposed on the contact structure 20', and the electronic device 1003 may further include a bit line structure 13 connecting a plurality of electric field effect transistors to each other.

Although FIG. 5 illustrates an example wherein the contact structure 20' and the capacitor CA3 which are repeatedly arranged along X and Y directions, the arrangement is not limited thereto. For example, the contact structure 20' may be arranged along the X and Y directions, and the capacitor CA3 may be arranged in a hexagonal shape such as a honeycomb structure.

Figure 6:
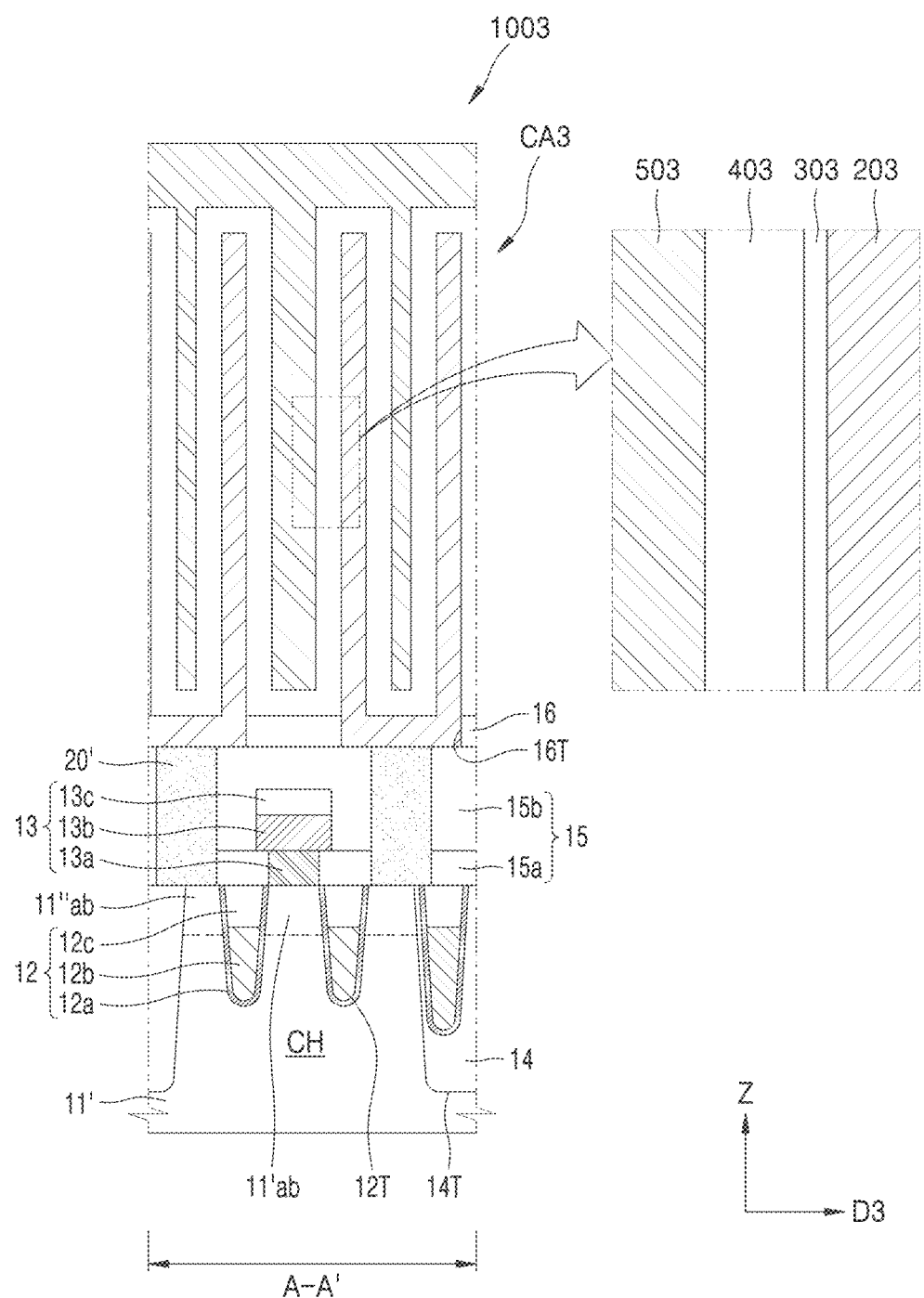
FIG. 6 is a cross-sectional view taken along line A-A' of FIG. 5.

FIG. 6 is a cross-sectional view taken along line A-A' of FIG. 5.

Referring to FIG. 6, the semiconductor substrate 11' may have a shallow trench isolation (STI) structure including a device isolation layer 14. The device isolation layer 14 may be a single layer including one kind of insulating layer or a multi-layer including a combination of two or more kinds of insulating layer. The device isolation layer 14 may include a device isolation trench 14T in the semiconductor substrate 11' and the device isolation trench 14T may be filled with an insulating material. The insulating material may include at least one selected from fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), and tonen silazene (TOSZ), but the material therefor is not limited thereto.

The semiconductor substrate 11' may further include a channel region CH defined by the device isolation layer 14 and a gate line trench 12T disposed parallel to an upper surface of the semiconductor substrate 11' and extending in the X direction. The channel region CH may have a relatively long island shape having shorter and longer axes. A longer axis of the channel region CH may be arranged in a direction D3 parallel to the upper surface of the semiconductor substrate 11' as shown in FIG. 5.

The gate line trench 12T may be disposed in the channel region CH or to cross the channel region CH at a predetermined depth from the upper surface of the semiconductor substrate 11'. The gate line trench 12T may also be disposed inside the device isolation trench 14T, and the gate line trench 12T inside the device isolation trench 14T may have a lower bottom surface than the gate line trench 12T of the channel region CH. The first source/drain 11'ab and the second source/drain 11"ab may be disposed on an upper portion of the channel region CH located on both sides of the gate line trench 12T.

A gate stack 12 may be disposed inside the gate line trench 12T. Specifically, a gate insulating layer 12a, a gate electrode 12b, and a gate capping layer 12c may be sequentially disposed inside the gate line trench 12T. The gate insulating layer 12a and the gate electrode 12b may be the same as described above, and the gate capping layer 12c may include at least one selected from silicon oxide, silicon oxynitride, and silicon nitride. The gate capping layer 12c may be disposed on the gate electrode GA to fill the remaining portion of the gate line trench 12T.

A bit line structure 13 may be disposed on the first source/drain 11'ab. The bit line structure 13 may be parallel to the upper surface of the semiconductor substrate 11' and extend along the Y direction. The bit line structure 13 may be electrically connected to the first source/drain 11'ab and may sequentially include, on the substrate, a bit line contact 13a, a bit line 13b, and a bit line capping layer 13c. For example, the bit line contact 13a may include polysilicon, the bit line 13b may include a metal material, and the bit line capping layer 13c may include an insulating material such as silicon nitride or silicon oxynitride.

Referring to FIG. 6, the bit line contact 13a has a bottom surface at the same level as the upper surface of the semiconductor substrate 11'. However, this is only an example, and the examples are not limited thereto. For example, in at least one embodiment, a recess formed to a certain depth from the upper surface of the semiconductor substrate 11" is further provided, and the bit line contact 13a extends to the inside of the recess, so that the bottom surface of the bit line contact 13a is at a lower level than the upper surface of the semiconductor substrate 11'.

The bit line structure 13 may further include a bit line interlayer (not shown) between the bit line contact 13a and the bit line 13b. The bit line interlayer may include a metal silicide, such as tungsten silicide, or a metal nitride, such as tungsten nitride. In at least one embodiment, a bit line spacer (not shown) may be further formed on the sidewall of the bit line structure 13. The bit line spacer may have a single-layer structure or a multi-layer structure, and may include an insulating material such as silicon oxide, silicon oxynitride, or silicon nitride. In at least one embodiment, the bit line spacer may further include an air space (not shown).

The contact structure 20' may be disposed on the second source/drain 11"ab. The contact structure 20' and the bit line structure 13 may be disposed on different sources/drains on a substrate. The contact structure 20' may have a structure in which a lower contact pattern (not shown), a metal silicide layer (not shown), and an upper contact pattern (not shown) are sequentially stacked on the second source/drain 11"ab. The contact structure 20' may further include a barrier layer (not shown) surrounding the side surface and the bottom surface of the upper contact pattern. For example, the lower contact pattern may include polysilicon, the upper contact pattern may include a metal material, and the barrier layer may include a conductive metal nitride.

The capacitor CA3 may be electrically connected to the contact structure 20' and disposed on the semiconductor substrate 11'. For example, the capacitor CA3 includes a lower electrode 203 electrically connected to the contact structure 20', an upper electrode 503 spaced apart from the lower electrode 203, a dielectric thin film 403 disposed between the lower electrode 203 and the upper electrode 503, and an interface layer 303 disposed between the lower electrode 203 and the dielectric thin film 403. Although not illustrated, the interface layer 303 includes a first interface layer and a second interface layer as described above. The lower electrode 203 may have a cylindrical shape or a cup shape with an inner space that is closed at the bottom thereof. The upper electrode 503 may have a comb shape having comb teeth extending into the inner space formed by the lower electrode 203 and a region between adjacent lower electrodes 203. The interface layer 303 and the dielectric thin film 403 may be disposed to be parallel to surfaces of the lower electrode 203 and the upper electrode 503 therebetween.

Since materials for the lower electrode 203, the interface layer 303, the dielectric thin film 403, and the upper electrode 503, constituting the capacitor CA3, are the same as and/or substantially similar to the materials described in connection with the capacitor 100 described above in FIG. 1, a description thereof will be omitted.

An interlayer insulating layer 15 may be further disposed between the capacitor CA3 and the semiconductor substrate 11'. The interlayer insulating layer 15 may be disposed in a space between the capacitor CA3 and the semiconductor substrate 11' where no other structure is disposed. For example, the interlayer insulating layer 15 may be disposed to cover the interconnection and/or the electrode structure, for example, the bit line structure 13, the contact structure 20', and the gate stack 12 on the substrate. For example, the interlayer insulating layer 15 may surround the wall of the contact structure 20'. The interlayer insulating layer 15 may include a first interlayer insulating layer 15a surrounding the bit line contact 13a and a second interlayer insulating layer 15b covering side surfaces and/or upper surfaces of the bit line 13b and the bit line capping layer 13c.

The lower electrode 203 of the capacitor CA3 may be disposed on the interlayer insulating layer 15, for example, on the second interlayer insulating layer 15b. Also, when a plurality of capacitors CA3 are disposed, bottom surfaces of the plurality of lower electrodes 203 may be separated by an etch stop layer 16. In other words, the etch stop layer 16 may have an opening 16T, and the bottom surface of the lower electrode 203 of the capacitor CA3 may be disposed in the opening 16T. The lower electrode 203 may have, as illustrated, a cylindrical shape or a cup shape with an inner space that is closed at the bottom thereof. The capacitor CA3 may further include a support portion (not shown) preventing the lower electrode 203 from tilting or falling, and the support portion may be disposed on a sidewall of the lower electrode 203.

Figure 7:
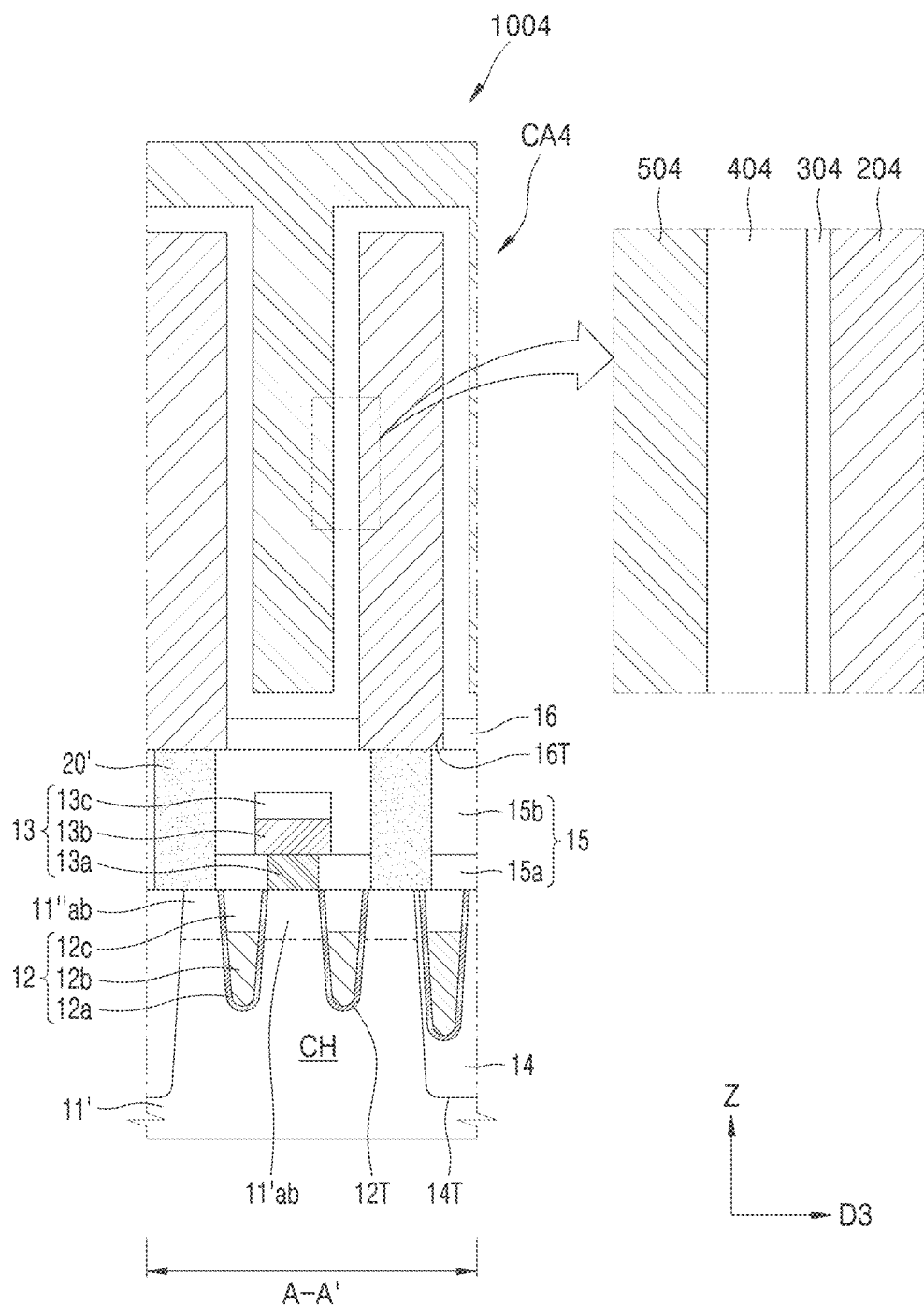
FIG. 7 is a cross-sectional view illustrating an electronic device according to at least one embodiment.

FIG. 7 is a cross-sectional view illustrating an electronic device 1004 according to at least one embodiment.

The electronic device 1004 corresponds to a cross-sectional view taken along the A-A' of FIG. 5, and is different from FIG. 6 only in the shape of a capacitor CA4. The capacitor CA4 is electrically connected to the contact structure 20' and disposed on the semiconductor substrate 11', and includes a lower electrode 204 electrically connected to the contact structure 20', an upper electrode 504 spaced apart from the lower electrode 204, a dielectric thin film 404 disposed between the lower electrode 204 and the upper electrode 504, and an interface layer 304 disposed between the lower electrode 204 and the dielectric thin film 404. Although not illustrated, the interface layer 304 includes a first interface layer and a second interface layer as described above. Materials for the lower electrode 204, the interface layer 304, the dielectric thin film 404, and the upper electrode 504 are substantially the same as those of the capacitor 100 described above in FIG. 1.

The lower electrode 204 may have a column shape such as a cylinder, a quadrangular pillar, or a polygonal pillar, each extending in a vertical direction (Z direction). The upper electrode 504 may have a comb shape having comb teeth extending to an area between adjacent lower electrodes 204. The dielectric thin film 404 may be disposed to be parallel to the surfaces of the lower electrode 204 and the upper electrode 504 therebetween.

Capacitors and electronic devices according to the some embodiments described above can be applied to various application fields. For example, an electronic device according to some embodiments may be applied as a logic element or a memory element. Electronic devices according to some embodiments may be used for arithmetic operations, program execution, temporary data retention, and the like in devices such as mobile devices, computers, notebooks, sensors, network devices, and neuromorphic devices. In addition, electronic elements and electronic devices according to the some embodiments may be useful for a device in which a data transmission amount is large and data transmission is continuously performed.

Figure 8:
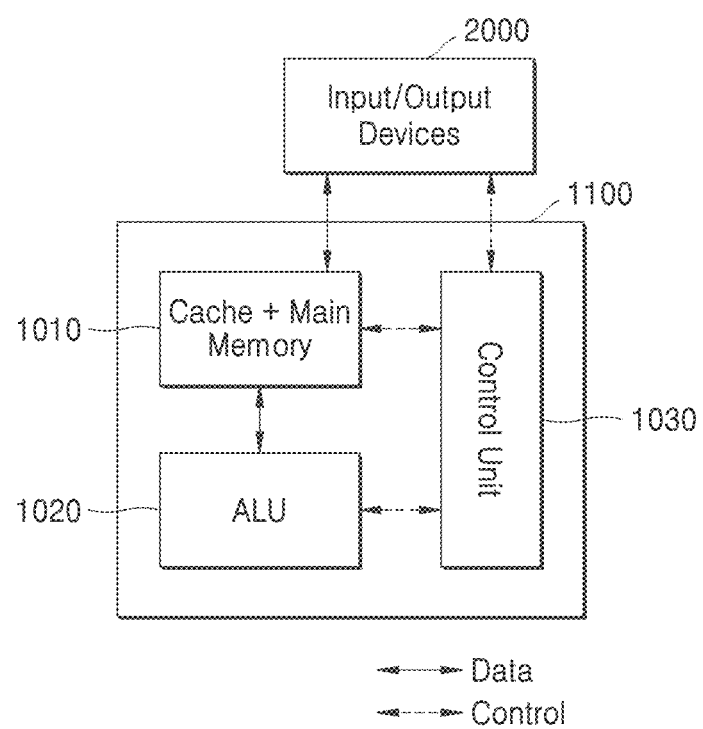
FIGS. 8 and 9 are conceptual diagrams schematically illustrating a device architecture applicable to a device according to at least one embodiment.
Figure 9:
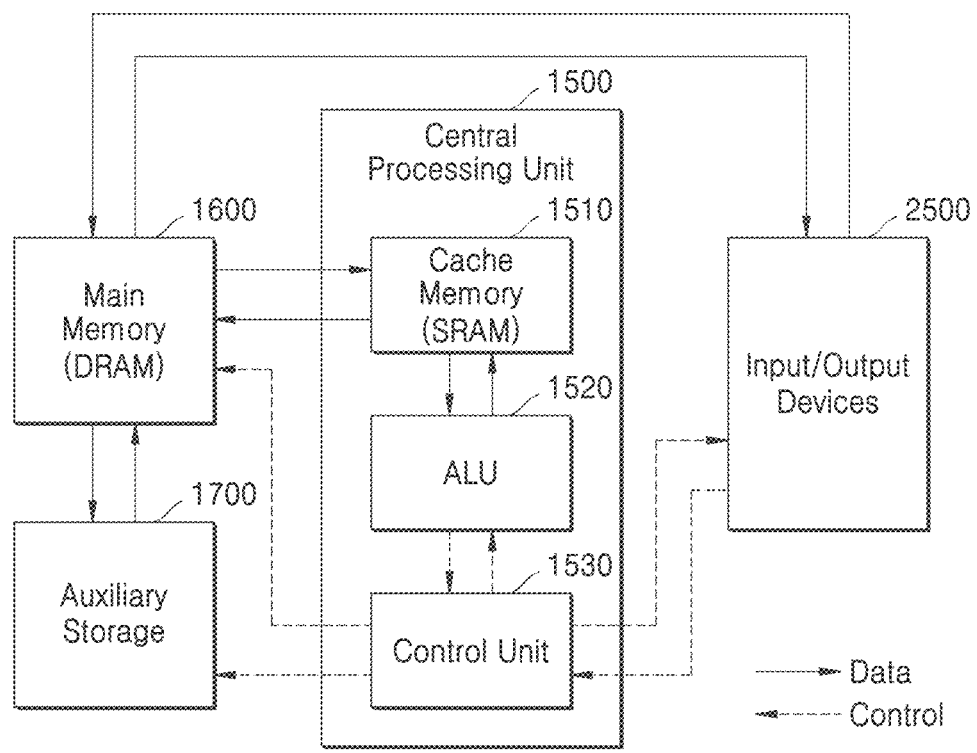

FIGS. 8 and 9 are conceptual diagrams schematically illustrating device architectures applicable to devices according to some embodiments.

Referring to FIG. 8, an electronic element architecture 1100 may include a memory unit 1010, an arithmetic logic unit (ALU) 1020, and a control unit 1030. The memory unit 1010, the ALU 1020 and the control unit 1030 may be electrically connected to each other. For example, the electronic element architecture 1100 may be implemented as a single chip including the memory unit 1010, the ALU 1020, and the control unit 1030.

The memory unit 1010, the ALU 1020, and the control unit 1030 may be connected to each other through a metal line on-chip and communicate together directly. The memory unit 1010, the ALU 1020, and the control unit 1030 may be monolithically integrated on one substrate to form one chip. An input/output device 2000 may be connected to the electronic element architecture 1100, which may be in the form of a chip. In at least one embodiment, the memory unit 1010 may include a main memory and a cache memory. The electronic element architecture 1100, which may be in the form of a chip, may be an on-chip memory processing unit. The memory unit 1010 may include a capacitor as described above, and an electronic device using the capacitor. The ALU 1020 or the control unit 1030 may each include the capacitor.

Referring to FIG. 9, a cache memory 1510, an ALU 1520, and a control unit 1530 may configure a central processing unit (CPU) 1500, and the cache memory 1510 may include a static random access memory (SRAM). In addition to the CPU 1500, a main memory 1600 and an auxiliary storage 1700 may be provided. The main memory 1600 may be a dynamic random access memory (DRAM) and may include the capacitor described above. In some cases, an electronic element architecture may be implemented in such a form that computing unit elements and memory unit elements are adjacent to each other in one chip without distinction of sub-units.

The disclosure will be described in more detail through the following Examples and Comparative Examples. However, Examples and Comparative Examples are intended to illustrate the technical idea, and the scope of the present disclosure is not limited thereto.

EXAMPLES (Layered Structure Formation)

Reference Example 1: TiN/TiO$_2$

A TiN thin film having a thickness of 100 Å was deposited on a silicon substrate by pulsed laser deposition (PLD), and an Al-doped TiO$_2$ thin film having a thickness of 50 Å was deposited on the TiN thin film by atomic layer deposition (ALD).

Reference Example 2: TiN/VO$_2$/TiO$_2$

A TiN thin film having a thickness of 100 Å was deposited on a silicon substrate by PLD, a VO$_2$ thin film having a thickness of 30 Å was deposited on the TiN thin film by PLD, and an Al-doped TiO$_2$ thin film having a thickness of 50 Å was formed on the VO$_2$ thin film by ALD.

Experimental Example 1: TiN/VO$_2$/SnO$_2$/TiO$_2$

A TiN thin film having a thickness of 100 Å was deposited on a Si substrate by PLD, a VO$_2$ thin film having a thickness of 30 Å and a SnO$_2$ having a thickness of 5 Å were sequentially deposited on the TiN thin film by PLD, and an Al-doped TiO$_2$ thin film having a thickness of 50 Å was formed on the SnO$_2$ thin film by ALD.

Experimental Example 2: TiN/VO$_2$/GeO$_2$/TiO$_2$

A TiN thin film having a thickness of 100 Å was deposited on a Si substrate by PLD, a VO$_2$ thin film having a thickness of 30 Å and a GeO$_2$ having a thickness of 5 Å were sequentially deposited on the TiN thin film by PLD, and an Al-doped TiO$_2$ thin film having a thickness of 50 Å was formed on the GeO$_2$ thin film by ALD.

Evaluation Example 1: TEM Analysis and Elemental Mapping

Figure 10:
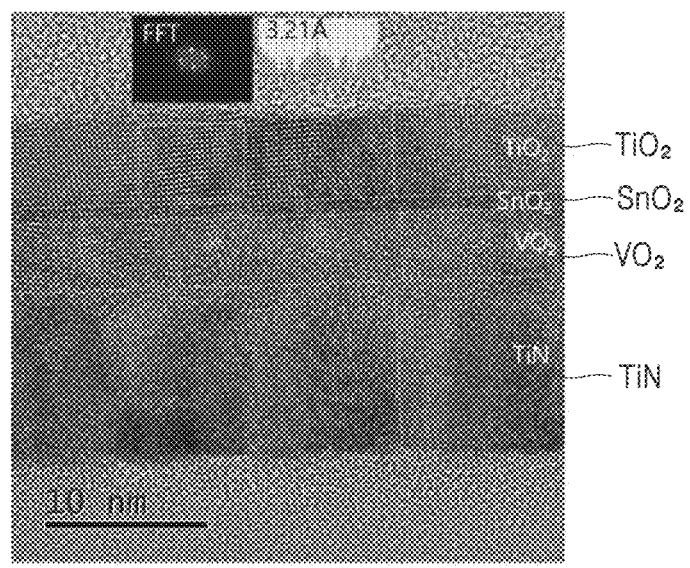
FIG. 10 is an HR-TEM image of a cross section of a layered structure of Experimental Example 1.

FIG. 10 shows a high resolution transmission electron microscope (HR-TEM) image of a cross section of a layered structure of Experimental Example 1, and FIGS. 11A to 11F show elemental mapping images of the layered structure of Experimental Example 1 obtained by using high-angle annular dark field image (HAADF)-scanning transmission electron microscope (STEM), and energy dispersive X-ray spectroscopy (EDS).

Figure 11A:
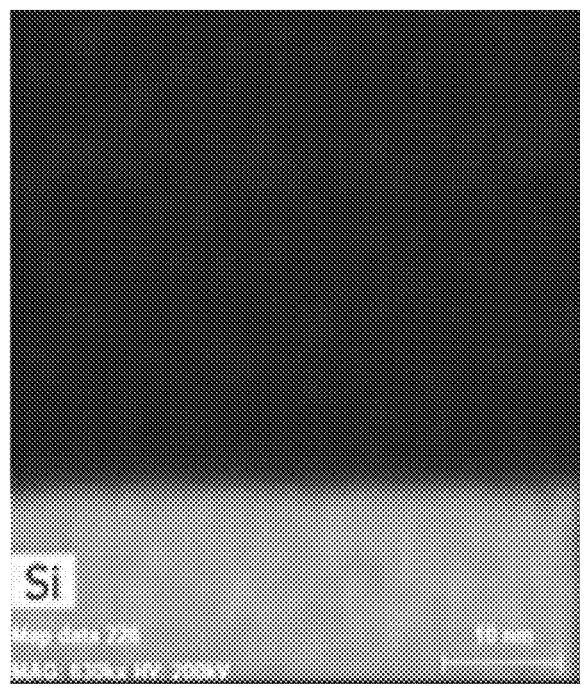
FIGS. 11A to 11F show element mapping images of the layered structure of Experimental Example 1.
Figure 11B:
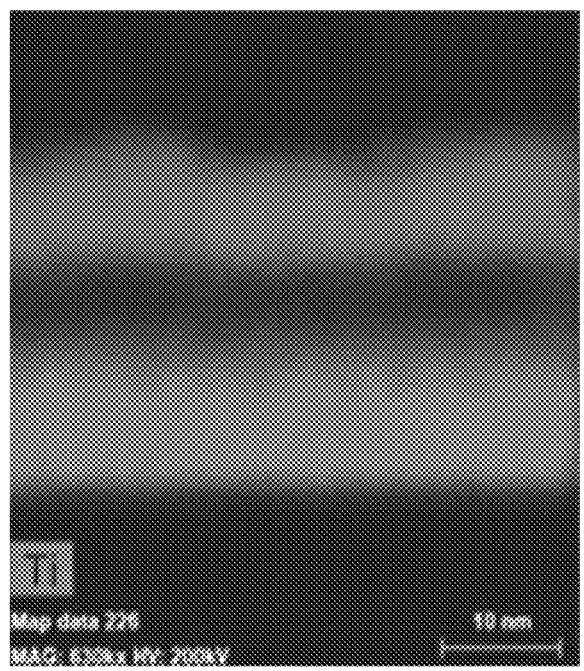
Figure 11C:
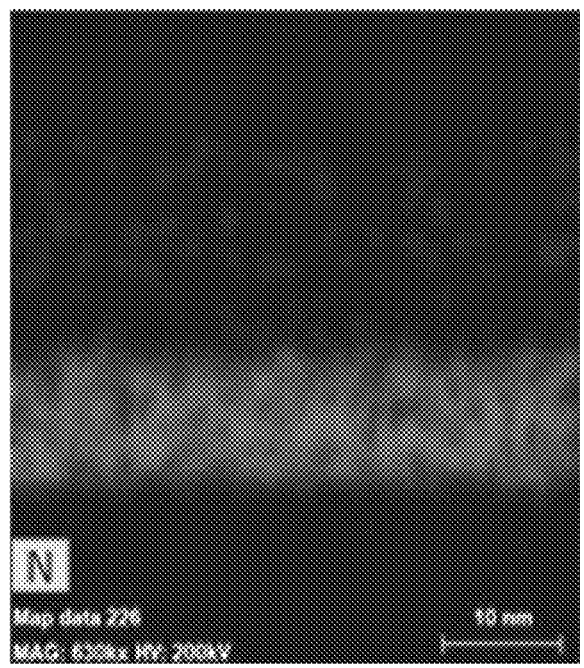
Figure 11D:
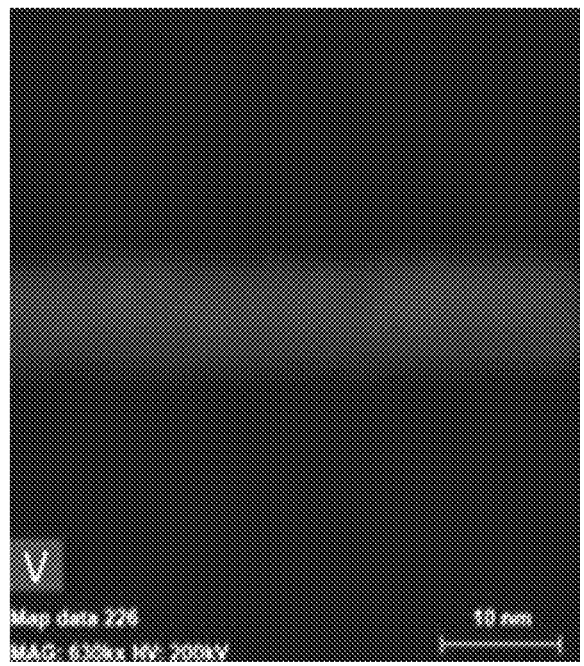
Figure 11E:
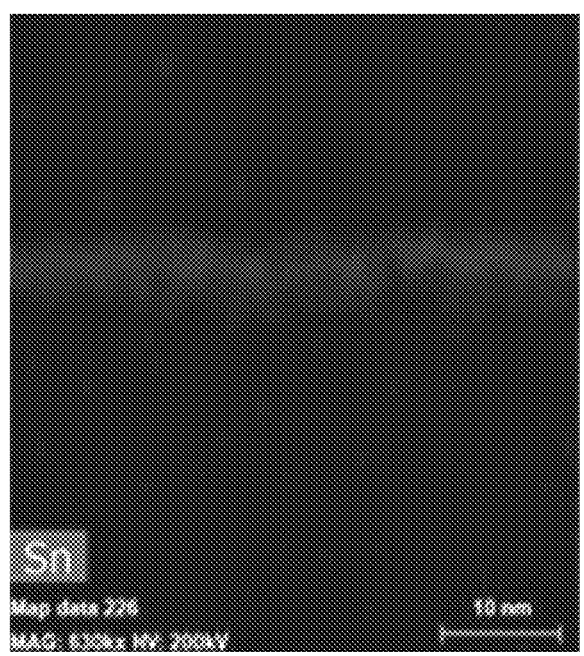
Figure 11F:
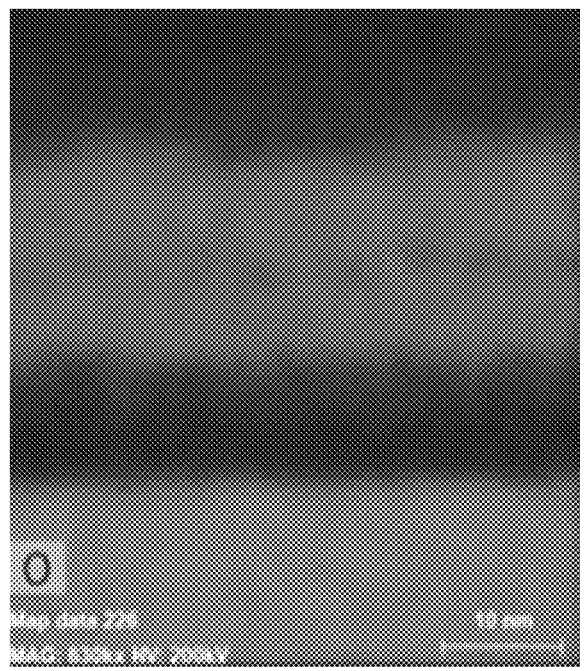

FIG. 11A shows the distribution of silicon (Si), FIG. 11B shows the distribution of titanium (Ti) element, FIG. 11C shows the distribution of nitrogen (N) element, FIG. 11D shows the distribution of vanadium (V) element, FIG. 11E shows the distribution of tin (Sn) element, and FIG. 11F shows the distribution of oxygen (O) element. Referring to FIGS. 10 and 11A to 11F, it can be seen that TiN, VO$_2$, SnO$_2$, and TiO$_2$ layers are uniformly formed as distinct layers on the Si substrate.

Figure 12:
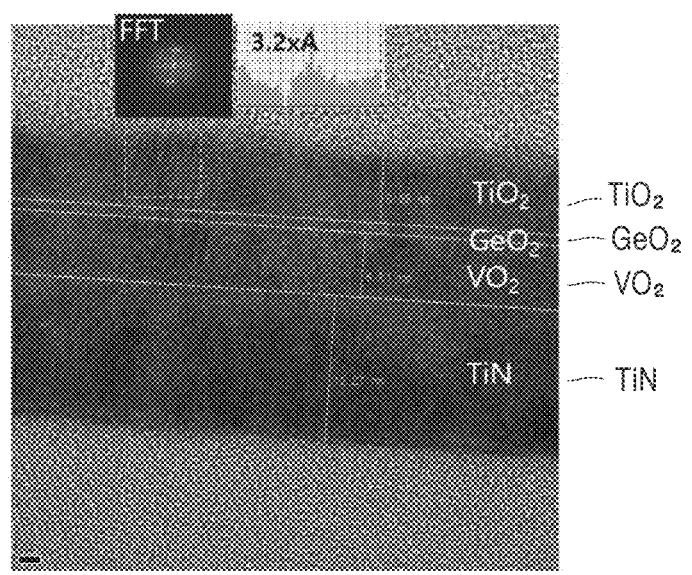
FIG. 12 is an HR-TEM image of a cross section of a layered structure of Experimental Example 2.

FIG. 12 shows an HR-TEM image of a cross section of a layered structure of Experimental Example 2, and FIGS. 13A to 13F show elemental mapping images of the layered structure of Experimental Example 2 by using HAADF and EDS.

Figure 13A:
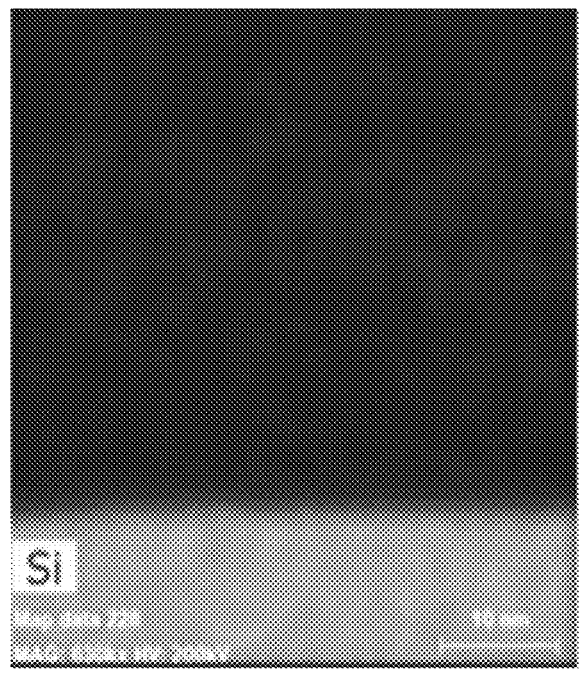
FIGS. 13A to 13F show element mapping images of the layered structure of Experimental Example 2.
Figure 13B:
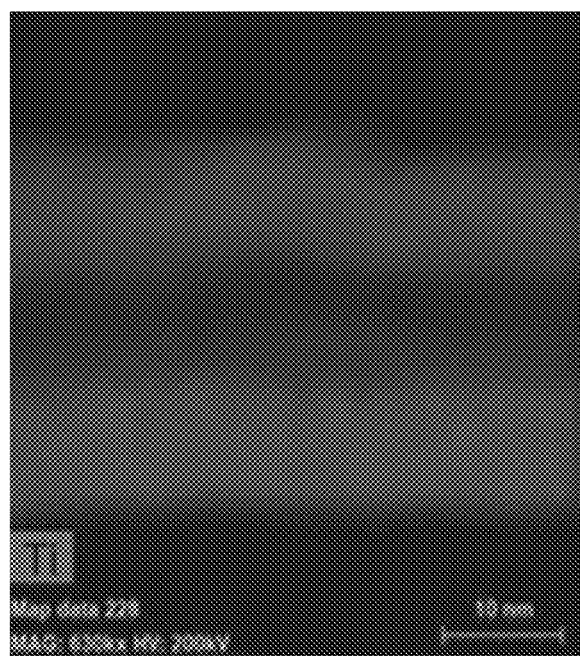
Figure 13C:
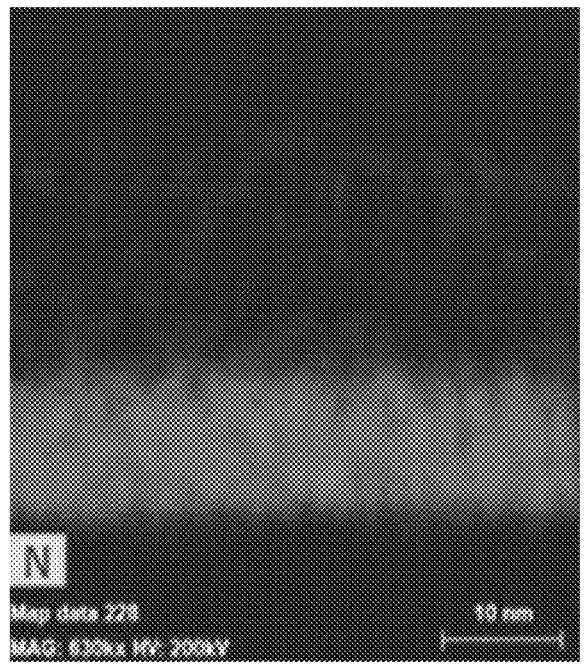
Figure 13D:
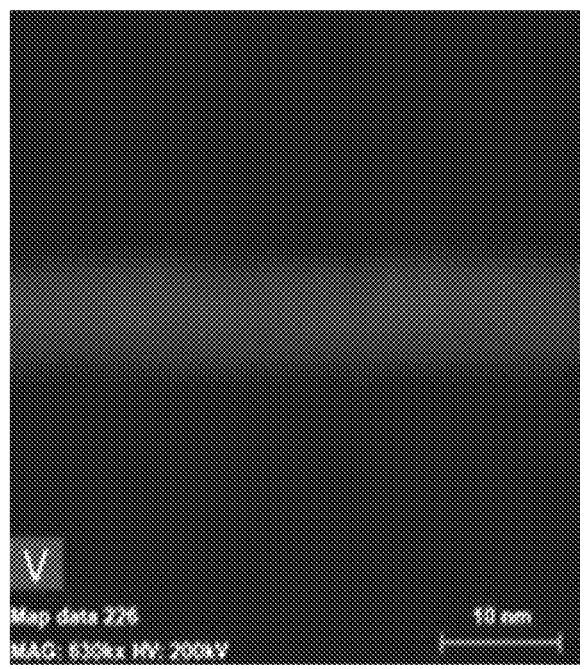
Figure 13E:
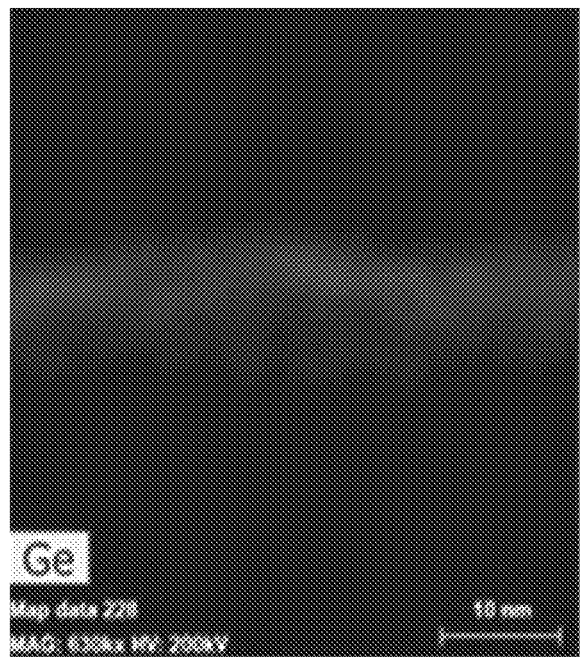
Figure 13F:
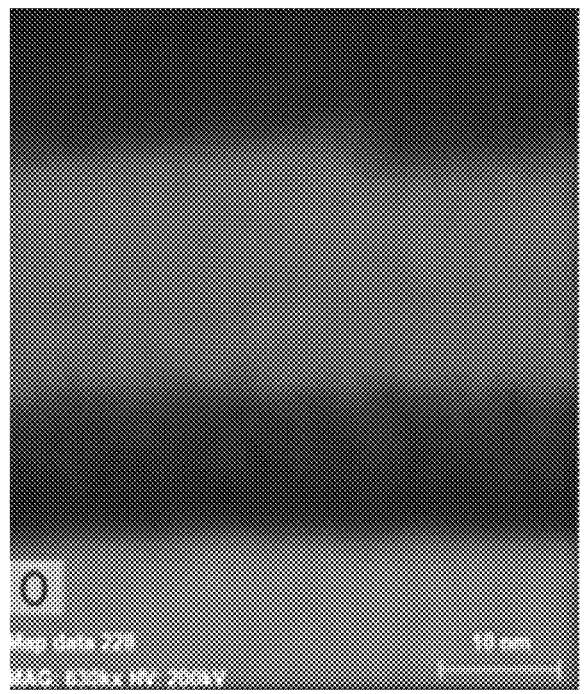

FIG. 13A shows the distribution of silicon (Si), FIG. 13B shows the distribution of titanium (Ti) element, FIG. 13C shows the distribution of nitrogen (N) element, FIG. 13D shows the distribution of vanadium (V) element, FIG. 13E shows the distribution of germanium (Ge) element, and FIG. 13F shows the distribution of oxygen (O) element. Referring to FIGS. 12 and 13A to 13F, it can be seen that TiN, $VO_2$, $GeO_2$, and $TiO_2$ layers are uniformly formed as distinct layers on the Si substrate.

Evaluation Example 2: XRD Analysis

Figure 14A:
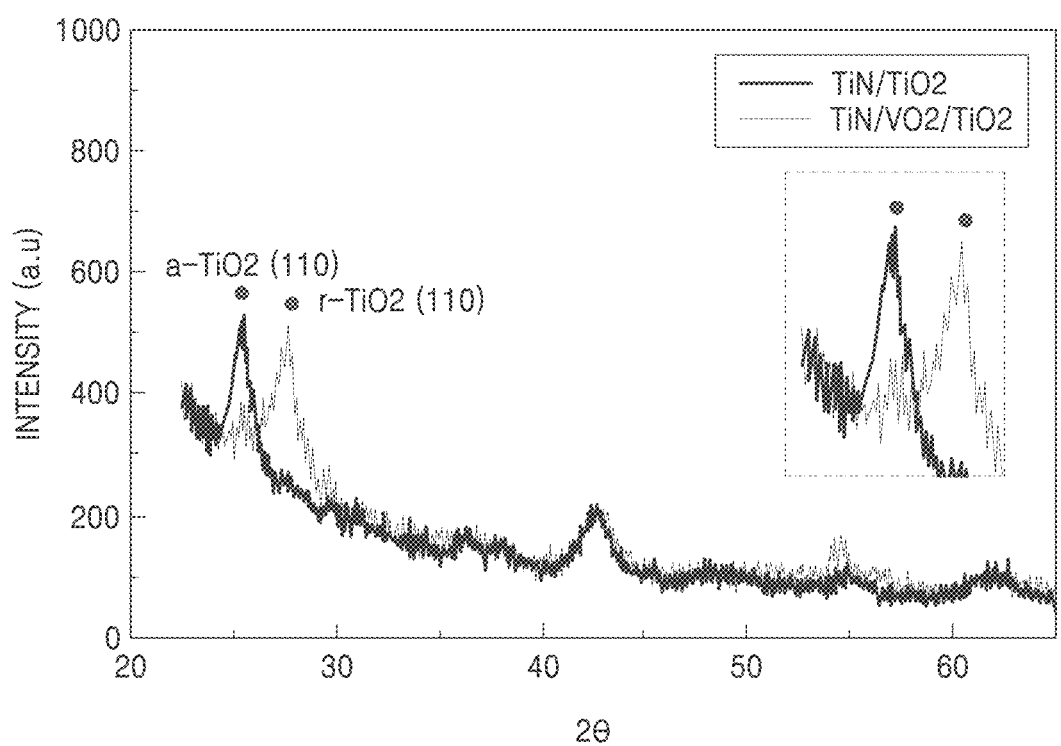
FIG. 14A shows grazing incidence X-ray diffraction (GIXRD) spectra of layered films prepared according to Reference Examples 1 and 2.
Figure 14B:
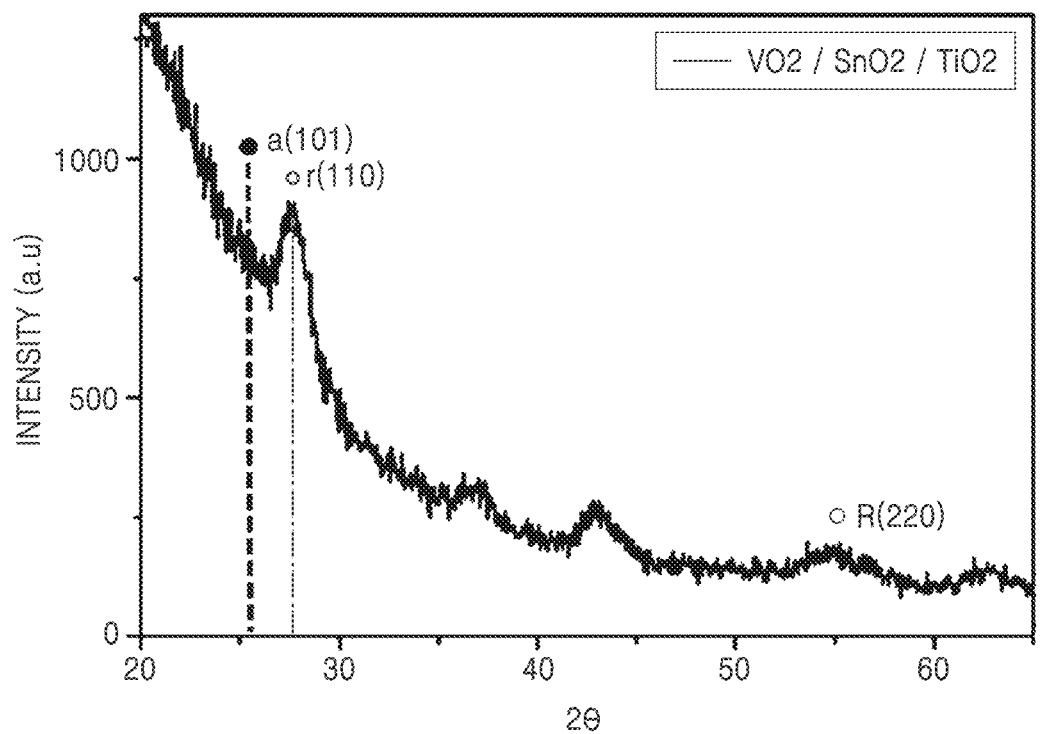
FIG. 14B shows GIXRD spectra of the layered film prepared according to Reference Example 1.

The grazing incidence X-ray diffraction (GI-XRD) spectra of stacked layers prepared according to Reference Examples 1 and 2 and Experimental Example 1, were measured. Measurements of Reference Examples 1 and 2 are shown in FIG. 14A, and the measurements of Experimental Example 1 are shown in FIG. 14B. Cu Kα radiation was used to measure the XRD spectrum.

Referring to FIG. 14A, peaks marked with circles correspond to the anatase phase and the rutile phase of $TiO_2$, respectively, and the peaks are enlarged and shown on the right side of the graph. Referring to FIG. 14A, the $TiO_2$ thin film of Reference Example 1 shows only an anatase phase peak, and the $TiO_2$ thin film of Reference Example 2 shows a main peak of the rutile phase and a small peak of an anatase phase peak. Referring to FIG. 14B, the $TiO_2$ thin film of Experimental Example 1 shows only the peak of the rutile phase, and does not show the peak of the anatase phase.

From the GI-XRD graphs of FIGS. 14A and 14B, it was confirmed that the $TiO_2$ thin film formed on TiN/$VO_2$/$SnO_2$ did not contain an anatase phase and did contain a rutile phase only. [00136](Manufacture of Capacitor)

Example 1: TiN/$VO_2$/$SnO_2$/$TiO_2$/Pt

A TiN thin film having a thickness of 100 Å was deposited on a silicon substrate by PLD to form a first electrode. A $VO_2$ thin film having a thickness of 30 Å and a $SnO_2$ thin film having a thickness of 5 Å were sequentially deposited on the first electrode by PLD to form a first interface layer and a second interface layer thereon.

An Al-doped $TiO_2$ thin film having a thickness of 50 Å was grown on the second interface layer by ALD to form a dielectric layer. A Pt thin film having a thickness of 200 Å was deposited on the dielectric layer by vapor deposition to form a second electrode.

Capacitor layer structure: 100 Å TiN/30 Å $VO_2$/5 Å $SnO_2$/50 Å $TiO_2$/200 Å Pt Example 2: TiN/$VO_2$/$GeO_2$/$TiO_2$/Pt A capacitor was manufactured in the same manner as in Example 1, except that the second interface layer was formed using $GeO_2$ instead of $SnO_2$. Capacitor layer structure: 100 Å TiN/30 Å $VO_2$/5 Å $GeO_2$/50 Å $TiO_2$/200 Å Pt Comparative Example 1: TiN/$VO_2$/$TiO_2$/Pt A capacitor was manufactured in the same manner as in Example 1, except that $VO_2$ of the first interface layer was formed to have a thickness of 10 Å without forming a second interface layer.

Comparative Example 2: TiN/$VO_2$/$TiO_2$/Pt

A capacitor was manufactured in the same manner as in Comparative Example 1, except that $VO_2$ of the first interface layer was formed to have a thickness of 20 Å.

Comparative Example 3: TiN/$VO_2$/$TiO_2$/Pt

A capacitor was manufactured in the same manner as in Comparative Example 1, except that $VO_2$ of the first interface layer was formed to have a thickness of 30 Å.

Evaluation Example 3: Measurement of leakage current

Figure 15:
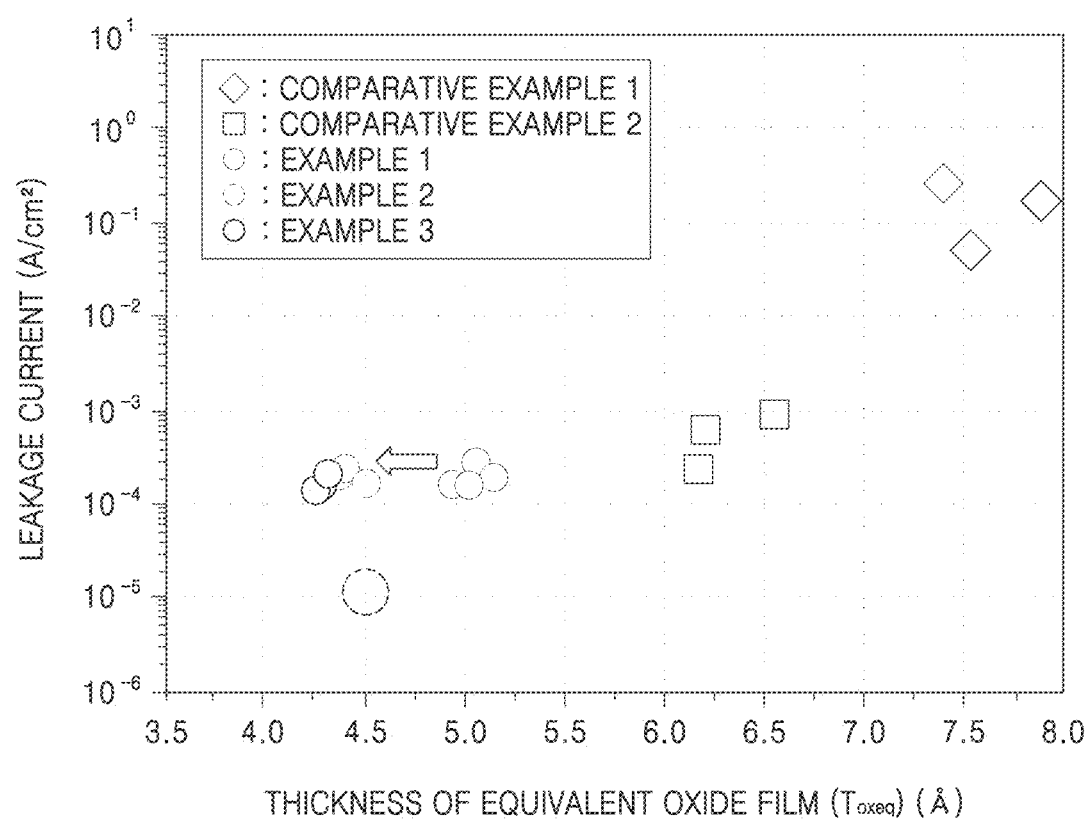
FIG. 15 is a graph of leakage current according to equivalent oxide film thickness measured for capacitors manufactured in Examples 1 and 2 and Comparative Examples 1 to 3.

The leakage current of each of the capacitors manufactured in Examples 1 and 2 and Comparative Examples 1 to 3, leakage current was equivalent oxide thickness (Toxeq). The measurement results are shown in FIG. 15. A plurality of capacitors for each of Examples 1 and 2 and Comparative Examples 1 to 3 was measured. The leakage current was measured. Referring to FIG. 15, the equivalent oxide film thickness (Toxeq) is a value obtained by converting the total thickness of the dielectric layer ($TiO_2$), the first interface layer ($VO_2$), and the second interface layer ($GeO_2$ or $SnO_2$) to the thickness of the silicon oxide film. The leakage current is the current density when a voltage of 1 V is applied to the capacitor.

Referring to FIG. 15, from among the capacitors of Comparative Examples 1 to 3 including only the first interface layer ($VO_2$), the capacitor of Comparative Example 3, in which the thickness of the first interface layer ($VO_2$) was 30 Å, had the smallest equivalent oxide thickness of about 5 Å, and the smallest leakage current of about $10^{-4}$ $A/cm^2$ to $10^{-3}$ $A/cm^2$.

The capacitors of Examples 1 and 2, which include both the first interface layer ($VO_2$) and the second interface layer ($GeO_2$ or $SnO_2$), had similar or slightly lower leakage current values than the capacitor of Comparative Example 3, but the equivalent oxide thickness thereof was about 4.4 Å, that is, was reduced by about 0.6 Å compared to the capacitor of Comparative Example 3.

Therefore, it can be seen that the leakage current and the thickness of the equivalent oxide film of the capacitor were reduced by the introduction of the first interface layer and the second interface layer.

The capacitors described above and electronic devices including the same have been described with reference to some embodiments illustrated in the drawings. However, it would be obvious to one of ordinary skill in the art that various modifications and other equivalent some embodiments can be made based on the some embodiments presented herein. Therefore, the disclosed some embodiments should be considered from an illustrative aspect rather than a limiting aspect. The scope of rights is shown in the claims rather than the foregoing description, and all differences within an equivalent scope should be construed as being included in the scope of rights.

A capacitor with improved capacitance and leakage current characteristics can be implemented by including a first interface layer and a second interface layer, which ensure a conduction band offset with the dielectric layer between the first electrode and the dielectric layer and improve the rutile phase of the dielectric layer.

It should be understood that some embodiments described herein should be considered in a descriptive sense only and not for purposes of limitation. Descriptions of features or aspects within each embodiment should typically be considered as available for other similar features or aspects in other some embodiments. While one or more some embodiments have been described with reference to the figures, it will be understood by those of ordinary skill in the art that various changes in form and details may be made therein without departing from the spirit and scope as defined by the following claims.

What is claimed is:

1. A capacitor comprising:
   a first electrode;
   a second electrode facing the first electrode;
   a dielectric layer between the first electrode and the second electrode, the dielectric layer comprising a dielectric of a rutile phase; and
   an interface layer between the first electrode and the dielectric layer, the interface layer including a first interface layer adjacent to the first electrode and a second interface layer between the dielectric layer and the first interface layer,
   wherein the first interface layer includes a conductive metal oxide having a work function in a range of about 4.8 eV to about 6.0 eV,
   the second interface layer includes a metal oxide having a rutile-phase crystal structure, and
   a thickness of the second interface layer is smaller than a thickness of the first interface layer.

2. The capacitor of claim 1, wherein the first interface layer comprises $VO_x$, wherein x is within a range of 2 to 3.

3. The capacitor of claim 1, wherein the first interface layer is doped with at least one of tungsten (W), tantalum (Ta), or niobium (Nb).

4. The capacitor of claim 1, wherein the thickness of the first interface layer is within a range of about 10 angstrom (Å) to about 100 Å.

5. The capacitor of claim 1, wherein the second interface layer includes at least one of germanium oxide ($GeO_2$) or tin oxide ($SnO_2$).

6. The capacitor of claim 1, wherein the thickness of the second interface layer is within a range of about 0.1 angstrom (Å) to about 10 Å.

7. The capacitor of claim 1, wherein an oxygen chemical potential of the second interface layer is greater than an oxygen chemical potential of the first interface layer.

8. The capacitor of claim 1, wherein the first electrode includes at least one of titanium nitride (TiN), vanadium nitride (VN), or molybdenum nitride (MoN).

9. The capacitor of claim 1, wherein the dielectric of the dielectric layer comprises rutile-phase $TiO_2$.

10. The capacitor of claim 9, wherein the dielectric layer comprises at least one of gallium (Ga), aluminum (Al), lanthanum (La), boron (B), indium (In), scandium (Sc), or yttrium (Y) in an amount greater than or equal to 0 atom % and less than or equal to about 10 atom %.

11. The capacitor of claim 1, wherein a dielectric constant of the dielectric layer is 50 or more.

12. The capacitor of claim 1, wherein a thickness of the dielectric layer is in a range of about 1 nm to about 20 nm.

13. The capacitor of claim 1, wherein each of the first electrode and the second electrode has a thickness in a range of about 10 nm to about 100 nm.

14. The capacitor of claim 1, wherein a leakage current of the capacitor is in a range of $1\times10^{-2}$ A/cm$^2$ to $1\times10^{-8}$ A/cm$^2$.

15. An electronic device comprising:
   a transistor; and
   a capacitor electrically connected to the transistor, the capacitor comprising
   a first electrode,
   a second electrode facing the first electrode,
   a dielectric layer between the first electrode and the second electrode, the dielectric layer including a dielectric of a rutile phase, and
   an interface layer between the first electrode and the dielectric layer, the interface layer including a first interface layer adjacent to the first electrode and a second interface layer between the first interface layer and the dielectric layer,
   wherein the first interface layer includes a conductive metal oxide having a work function in a range of about 4.8 eV to about 6.0 eV,
   the second interface layer includes a metal oxide having a rutile-phase crystal structure, and
   a thickness of the second interface layer is smaller than a thickness of the first interface layer.

16. The electronic device of claim 15, wherein the first interface layer comprises $VO_x$, wherein x is within in a range of 2 to 3.

17. The electronic device of claim 15, wherein the first interface layer is doped with at least one of tungsten (W), tantalum (Ta), or niobium (Nb).

18. The electronic device of claim 15, wherein the second interface layer comprises at least one of germanium oxide ($GeO_2$), tin oxide ($SnO_2$), or manganese oxide ($MnO_2$).

19. The electronic device of claim 15, wherein a thickness of the second interface layer is within a range of about 0.1 Å to about 10 Å.

20. The electronic device of claim 15, wherein the dielectric of the dielectric layer comprises rutile-phase $TiO_2$.

* * * * *